United States Patent [19]
Smolley

[11] Patent Number: 5,315,481
[45] Date of Patent: May 24, 1994

[54] PACKAGING CONSTRUCTION FOR SEMICONDUCTOR WAFERS

[75] Inventor: Robert Smolley, Porteuguese Bend, Calif.

[73] Assignee: TRW Inc., Redondo Beach, Calif.

[21] Appl. No.: 492,008

[22] Filed: Mar. 12, 1990

Related U.S. Application Data

[63] Continuation-in-part of Ser. No. 835,818, Mar. 3, 1986, Pat. No. 5,007,841, which is a continuation-in-part of Ser. No. 499,137, May 31, 1983, abandoned, and a continuation-in-part of Ser. No. 499,136, May 31, 1983, Pat. No. 4,574,331.

[30] Foreign Application Priority Data

May 15, 1984 [EP] European Pat. Off. ........ 84303285.5
May 29, 1984 [KR] Rep. of Korea ...................... 2954/84
May 31, 1984 [JP] Japan .................................. 59-112169

[51] Int. Cl.$^5$ ........................... H05K 7/20; H05K 1/14
[52] U.S. Cl. ..................................... 361/707; 361/785; 361/790; 439/66; 439/74
[58] Field of Search ...................... 361/392-396, 361/399, 401, 408, 412-414; 439/66, 74, 91, 591-592

[56] References Cited

U.S. PATENT DOCUMENTS

| | | | |
|---|---|---|---|
| 3,200,297 | 8/1965 | Gibson | 317/101 |
| 3,327,278 | 6/1967 | Godel | 339/18 |
| 3,616,532 | 2/1971 | Beck | 361/412 |
| 3,885,173 | 5/1975 | Lee | 310/9.4 |
| 3,904,934 | 9/1975 | Martin | 361/412 |
| 4,249,302 | 2/1981 | Crepeau | 361/414 |
| 4,420,767 | 12/1983 | Hodge et al. | 357/81 |
| 4,484,215 | 11/1984 | Pappas | 357/80 |
| 4,502,098 | 2/1985 | Brown et al. | 361/412 |
| 4,581,679 | 4/1986 | Smolley | 361/414 |
| 4,603,374 | 7/1986 | Wasielewski | 361/389 |
| 4,618,739 | 10/1986 | Theobald | 174/52 FP |
| 4,620,761 | 11/1986 | Smith et al. | 339/75 MP |
| 4,755,910 | 7/1988 | Val | 361/401 |
| 4,774,632 | 9/1988 | Neugebauer | 361/386 |
| 4,802,062 | 1/1989 | Blum et al. | 361/401 |
| 4,807,019 | 2/1989 | Tustaniwskyj | 357/74 |
| 5,007,841 | 4/1991 | Smolley | 439/66 |

Primary Examiner—Gregory D. Thompson
Attorney, Agent, or Firm—Ronald L. Taylor

[57] ABSTRACT

The present invention resides in a packaging construction for removably mounting and interconnecting semiconductor wafers with minimized interconnection lead lengths between the wafers and with a high packing density. The wafer packaging construction includes a multilayer printed circuit board, an insulating board interposed between each wafer and the circuit board and upper and lower housing sections. Electrical connections between contact areas on each semiconductor wafer and the multilayer circuit board are established by compressing the housing sections together, thus compressing wadded-wire connector elements positioned in openings of the insulating boards against the wafer contact areas and the multilayer circuit board contact areas. The novel construction of the invention eliminates the need for soldering, removes the interconnect inductance of the fine wires used in conventional packaging constructions, dramatically increases the number of wafers that can be mounted on a single multilayer circuit board, and substantially reduces signal propagation time between circuits.

12 Claims, 2 Drawing Sheets

PACKAGING CONSTRUCTION FOR SEMICONDUCTOR WAFERS

This application is a continuation-in-part of an application by the same inventor entitled "Integrated-Circuit Chip Interconnection System," having a filing date of Mar. 3, 1986 and Ser. No. 06/835,818 issued as U.S. Pat. No. 5,007,841. The '818 application is in turn a continuation-in-part of two other applications by the same inventor entitled "Button Board Chip Interconnection System," having a filing date of May 31, 1983 and Ser. No. 499,137, and "Multi-Element Circuit Construction," having a filing date of May 31, 1983 and Ser. No. 499,136. The '137 application was subsequently abandoned in favor of the '818 application and the '136 application issued as U S. Pat. No. 4,574,331 on Mar. 3, 1986. The present application is also related to an earlier-filed application by the same inventor entitled "Multilayer Circuit Board Interconnection," having a filing date of Aug. 25, 1965 and Ser. No. 482,372, and subsequently abandoned.

BACKGROUND OF THE INVENTION

This invention relates generally to techniques for packaging and interconnecting integrated circuits and, more particularly, to techniques for packaging and interconnecting integrated circuits covering an entire semiconductor wafer.

Integrated circuits are generally fabricated on a wafer of semiconductor material, such as silicon, and cut into individual integrated-circuit (IC) chips. Each IC chip is then encapsulated in a chip package, typically of plastic or ceramic, to protect the chip from contamination and provide input/output pins for soldering the chip onto a printed circuit board. Inside the chip package, the input/output contact areas of the IC chip are electrically connected to the input/output pins of the chip package by soldering extremely fine wires between the chip contact areas and the package pins.

Although this type of IC chip packaging construction is widely used, it has several disadvantages, especially when used in more advanced circuit applications. One disadvantage is that the chip packages require a large volume, thus severely limiting the chip densities that can be achieved. Another disadvantage is that the resulting long interconnection lengths between IC chips contribute to signal propagation delays and signal distortions. Still another disadvantage is that the use of fine soldered wires between the chip contact areas and the package pins requires expensive tooling and special labor, causes poor quality connections and increases the inductance of the interconnections.

To minimize these disadvantages, integrated circuits covering an entire semiconductor wafer have been fabricated. These wafer scale integrated circuits reduce the distances between circuits, thus providing faster switching speeds, while reducing the number of interconnections between circuits, thus lessening the probability of defective interconnections. In addition, the volume required by a wafer scale integrated circuit is substantially less than the volume required by the same integrated circuit on multiple IC chips.

Several different packaging constructions for semiconductor wafers are disclosed in U.S. Pat. No. 4,603,374 to Wasielewski, U.S. Pat. No. 4,755,910 to Val and U.S. Pat. No. 4,484,215 to Pappas. However, all of these packaging constructions rely on the conventional interconnection techniques discussed above and do not attempt to minimize the lead lengths between interconnected circuits or provide a high packing density. The present invention is directed to these ends.

SUMMARY OF THE INVENTION

The present invention resides in a packaging construction for removably mounting and interconnecting semiconductor wafers with minimized interconnection lead lengths between the wafers and with a high packing density. The wafer packaging construction includes a multilayer printed circuit board, an insulating board interposed between each wafer and the circuit board and upper and lower housing sections. Electrical connections between contact areas on each semiconductor wafer and the multilayer circuit board are established by compressing the housing sections together, thus compressing connector elements positioned in openings of the insulating boards against the wafer contact areas and the multilayer circuit board contact areas.

The connector elements are preferably each formed as a single strand of wadded wire that protrudes slightly above and below the insulating board and makes electrical contact at multiple points when compressed against a contact area. Connectors of this type have significant advantages over soldered or wire-wrapped connections, and provide connections of high integrity and reliability. In contrast to a soldered connection, this mechanical connector element has very few associated variables that can affect the quality of the connection. The only significant variables are the size of the element and the compressive force used to make the connection, both of which can be accurately controlled.

The multilayer printed circuit board can be either a conventional multilayer circuit board or a layer-replaceable multilayer circuit board using the technique of the present invention. A layer-replaceable circuit board is comprised of alternating layers of two-sided circuit boards and insulating boards. Electrical connections between contact areas of adjacent circuit boards are established by compressing the circuit boards and insulating boards together, thus compressing connector elements positioned in openings of the insulating boards against the contact areas.

It will be appreciated from the foregoing that the present invention represents a significant advance in the field of integrated circuit packaging. In particular, the novel construction of the invention eliminates the need for soldering, removes the interconnect inductance of the fine wires used in conventional packaging constructions, dramatically increases the number of wafers that can be mounted on a single multilayer circuit board, and substantially reduces signal propagation time between circuits. Other features and advantages of the present invention will become apparent from the following more detailed description, taken in conjunction with the accompanying drawings, which illustrate, by way of example, the principles of the invention.

DESCRIPTION OF THE PREFERRED EMBODIMENTS

Integrated circuits covering an entire semiconductor wafer have been fabricated. These wafer scale integrated circuits reduce the distances between circuits, thus providing faster switching speeds, while reducing the number of interconnections between circuits, thus lessening the probability of defective interconnections. In addition, the volume required by a wafer scale integrated circuit is substantially less than the volume required by the same integrated circuit on multiple integrated-circuit (IC) chips. However, traditional packaging constructions for semiconductor wafers rely on conventional interconnection techniques and do not attempt to minimize the lead lengths between interconnected circuits or provide a high packing density.

Figure 1:
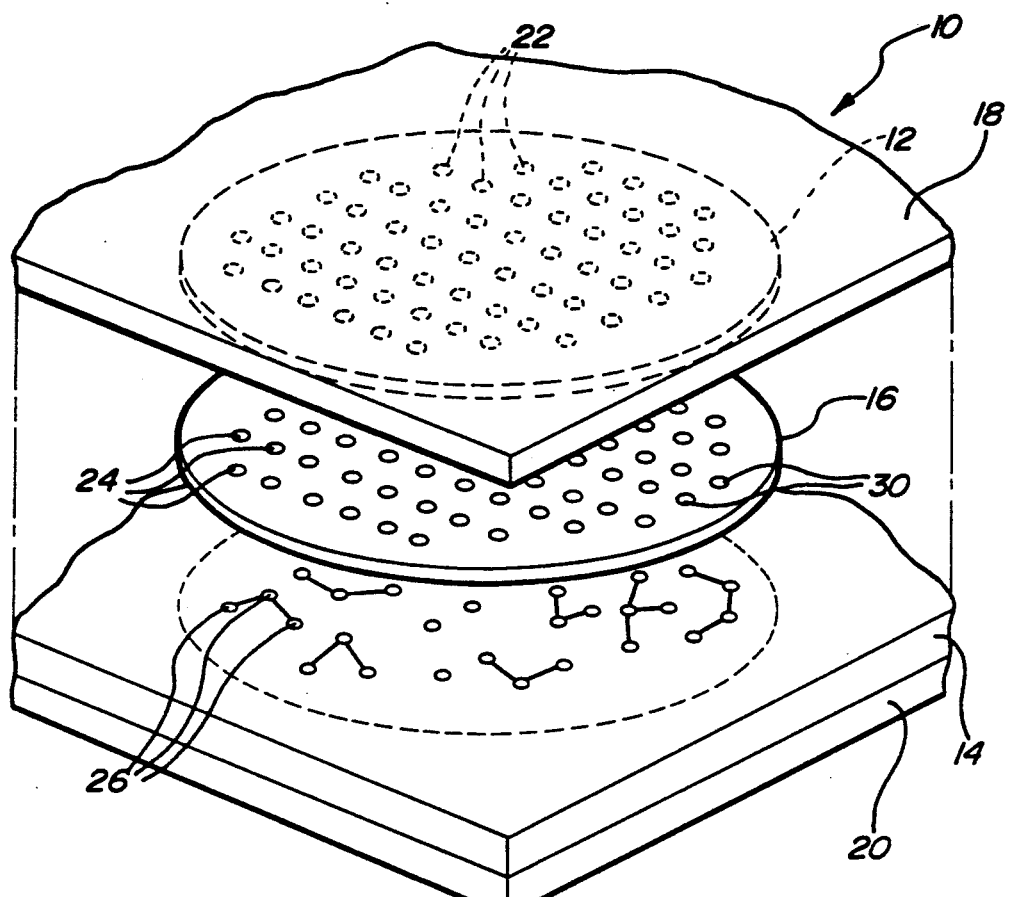
FIG. 1 is a fragmentary perspective view of a packaging construction for semiconductor wafers in accordance with the present invention.
Figure 2:
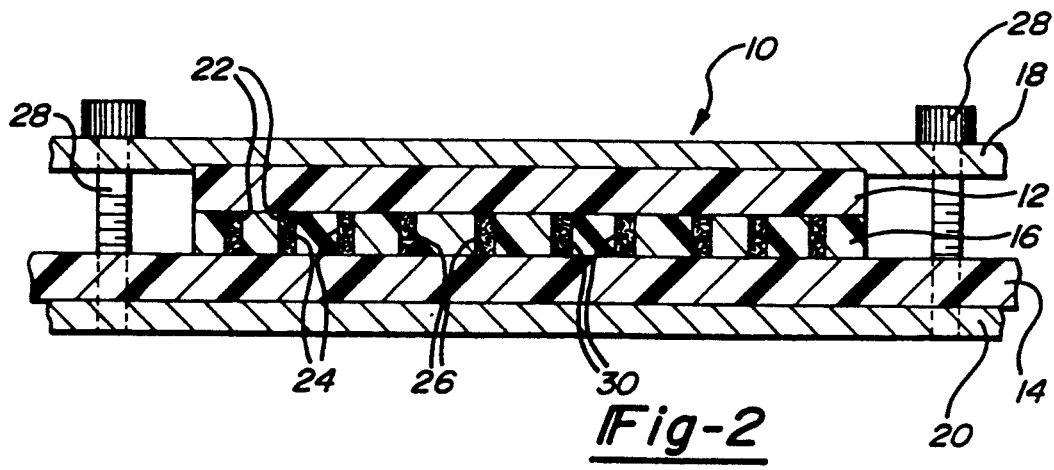
FIG. 2 is a fragmentary sectional view of the packaging construction of the present invention.

As shown in the drawings for purposes of illustration, the present invention is embodied in a packaging construction for removably mounting and interconnecting semiconductor wafers with minimized interconnection lead lengths between the wafers and with a high packing density. FIGS. 1 and 2 illustrate one preferred embodiment of a wafer packaging construction 10 in accordance with the present invention. The wafer packaging construction 10 includes one or more semiconductor wafers 12, a multilayer printed circuit board 14, insulating boards 16 and upper and lower housing sections 18, 20. The wafers 12 are mounted in recessed areas of the upper housing section 18, which also serves as a heat sink for the wafers 12. The exposed face of each wafer 12 has a plurality of thin-film metalization contact areas or pads 22 for connecting the input/output leads of the various circuits within the wafer 12 to the multilayer circuit board 14.

The insulating boards 16, commonly referred to as button boards, are interposed between each wafer 12 and the multilayer circuit board 14. Each insulating board 16 has a plurality of circular openings 24 at positions corresponding to the wafer contact areas 22. The multilayer circuit board 14 has contact areas 26 at positions corresponding to the openings 24 in the insulating boards 16. Electrical connections between the wafer contact areas 22 and the multilayer circuit board contact areas 26 are established by compressing the housing sections 18, 20 together using bolts 28. This compresses connector elements 30 positioned in the openings 24 of the insulating boards 16 against the wafer contact areas 22 and the multilayer circuit board contact areas 26.

The insulating boards or button boards 16 are preferably formed from an insulating material, such as glass ceramic. Each of the connector elements 30 is preferably formed from a single strand of metal wire, each strand being wadded together to form a nearly cylindrical "button" of material having a density of between twenty and thirty percent. Each wadded-wire connector element 30 protrudes slightly above and below the insulating board 16 and makes electrical contact at multiple points when compressed against a contact area. Connectors of this type have significant advantages over soldered or wire-wrapped connections, and provide connections of high integrity and reliability. In contrast to a soldered connection, this mechanical connector element has very few associated variables that can affect the quality of the connection. The only significant variables are the size of the element and the compressive force used to make the connection, both of which can be accurately controlled.

The wadded-wire connector elements 30 employed in the illustrative embodiments are fabricated using approximately 0.0003 to 0.0005 inch copper alloy wire. The wire is wadded into a nearly cylindrical button to fit snugly into a 0.003 to 0.005 inch diameter opening in the insulating board 16. The wadded-wire connector elements 30 can be fabricated from such copper alloys as beryllium and copper or silver and copper. Each wadded-wire connector element 30, when under compression, makes multiple contacts with a contact pad, and provides multiple conductive paths. In addition, each contact made by the wadded-wire connector element 30 is at very high pressure, because of the type of spring formed by the wadded wire and the small area of each contact point. In the embodiments described, the wadded-wire connector elements 30 are manufactured by Technical Wire Products, Inc. of Piscataway, N.J., under the trademark Fuzz Button, or by HRA Corporation, Redondo Beach, Calif.

The compression of the wadded-wire connector elements 30 is substantially elastic so that, when the compressive force is removed, the wadded-wire connector elements 30 return to their original shape. This allows the wafers 12 to be removed and replaced and the wadded-wire connector elements 30 and the insulating boards 16 to be used again. The wafers 12 are easily removed by unscrewing the bolts 28 and removing the housing sections 18, 20. The wafers 12 are then removed and replaced and the foregoing procedure reversed.

Figure 3:
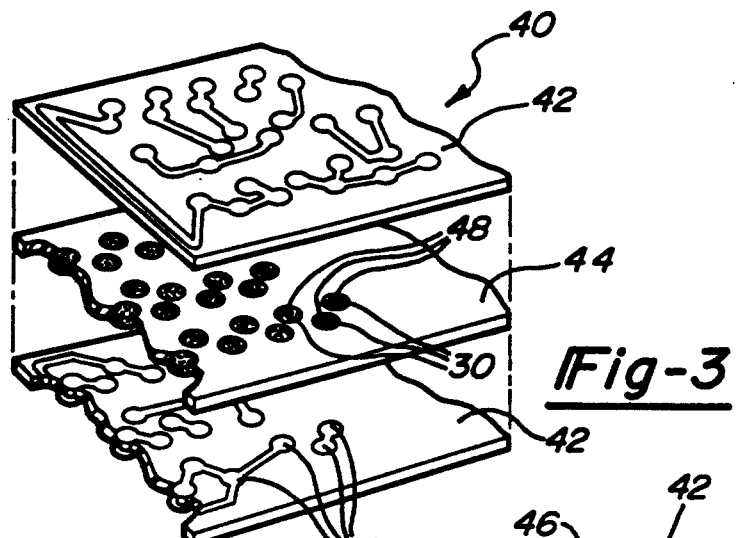
FIG. 3 is a fragmentary perspective view of the interconnection of two circuit boards using the technique of the present invention.
Figure 4:
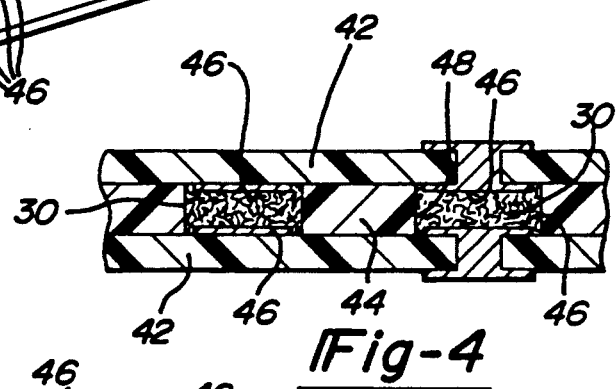
FIGS. 4 and 5 are fragmentary sectional views of the interconnection of two circuit boards using the technique of the present invention.

The multilayer printed circuit board 14 can be either a conventional multilayer circuit board or a layer-replaceable multilayer circuit board using the technique of the present invention. As illustrated in FIGS. 3 and 4, a layer-replaceable circuit board 40 is comprised of alternating layers of two-sided circuit boards 42 and insulating boards 44. The faces of the circuit boards 42 have a plurality of thin-film metalization contact areas or pads 46 and the insulating boards 44 have a plurality of circular openings 48 at positions corresponding to the contact areas 46. Electrical connections between the contact areas 46 of adjacent circuit boards 42 are established by compressing the circuit boards 42 and insulating boards 44 together, thus compressing connector elements 30 positioned in the openings 48 of the insulating boards 44 against the contact areas 46.

Figure 5:
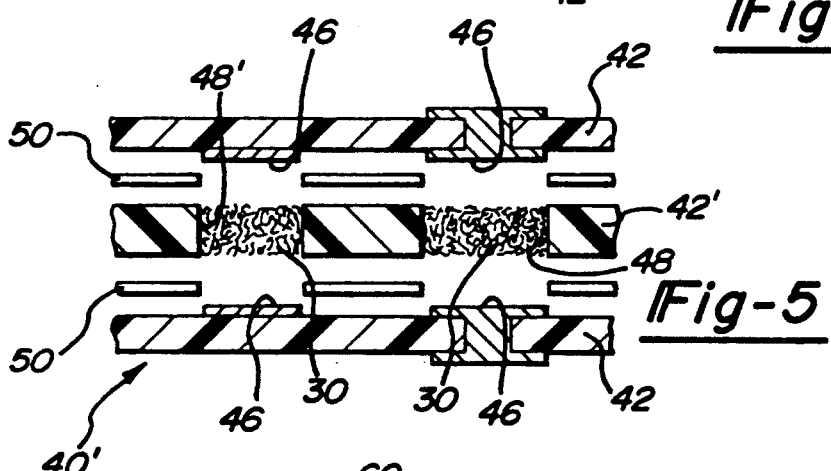

As illustrated in FIG. 5, another embodiment of the layer-replaceable multilayer circuit board, identified as multilayer circuit board 40', includes alternating two-sided circuit boards 42 and interconnecting circuit boards 42'. The interconnecting circuit boards 42' have a plurality of circular openings 48' at positions corresponding to the contact areas 46. Electrical connections between the contact areas 46 of adjacent two-sided circuit boards 42 are established by compressing the circuit boards 42, 42' together, thus compressing connector elements 30 positioned in the openings 48' of the interconnecting circuit boards 42' against the contact areas 46. Thin mylar sheets 50 between the circuit boards 42, 42' insulate the circuit boards from each other.

One of the advantages of these layer-replaceable multilayer circuit boards 40, 40' is that the circuit boards 42, 42' can be of materials with a lower dielectric constant than conventional multilayer circuit boards. Another advantage of these layer-replaceable multilayer circuit boards is that, because of a small design change, only one layer of the layer-replaceable multilayer circuit board has to be replaced, not the whole multilayer circuit. The layer-replaceable multilayer circuit board 42' is particularly useful where volume is very critical, since interconnecting circuit board 42' also includes circuit paths.

Figure 6:
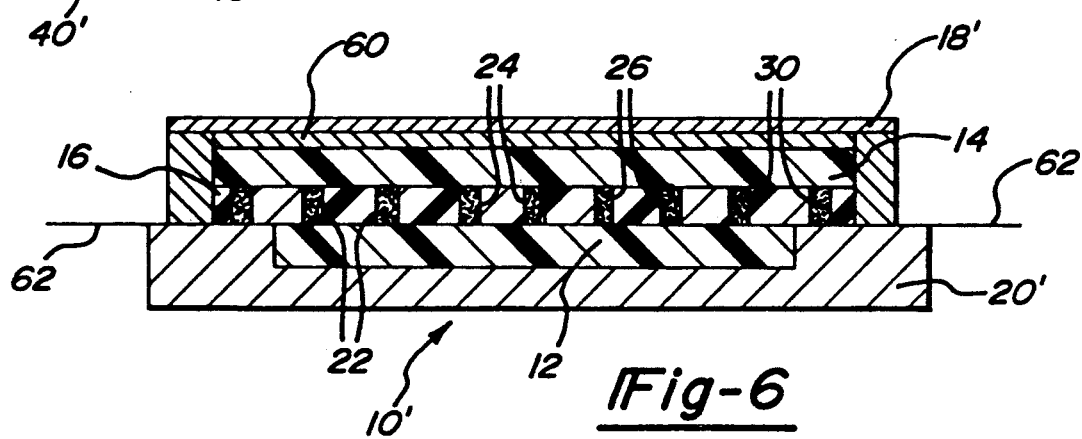
FIG. 6 is a fragmentary perspective view of another embodiment of the packaging construction of the present invention.

FIG. 6 illustrates another preferred embodiment of the wafer packaging construction of the present invention. A wafer packaging construction 10' includes one or more semiconductor wafers 12, the multilayer printed circuit board 14, the insulating boards 16 and upper and lower housing sections 18', 20'. The wafers 12 are mounted in recessed areas of the lower housing section 20', which also serves as a heat sink for the wafers 12. The exposed face of each wafer 12 has a plurality of thin-film metalization contact areas or pads 22 for connecting the input/output leads of the various circuits within the wafer 12 to the multilayer circuit board 14.

The insulating boards 16 are interposed between each wafer 12 and the multilayer circuit board 14. Each insulating board 16 has a plurality of circular openings 24 at positions corresponding to the wafer contact areas 22. The multilayer circuit board 14 has contact areas 26 at positions corresponding to the openings 24 in the insulating boards 16. Electrical connections between the wafer contact areas 22 and the multilayer circuit board contact areas 26 are established by compressing the housing sections 18', 20' together. This compresses connector elements 30 positioned in the openings 24 of the insulating boards 16 against the wafer contact areas 22 and the multilayer circuit board contact areas 26. A silicone pad 60 is interposed between the upper housing section 18' and the multilayer printed circuit board 14. Leads 62 extend out from the packaging construction 10' for making electrical connections to the wafers 12.

Also shown in FIG. 6, element 71 is provided along the ends of board 14 and between housing sections 18' and 20'; under which leads 62 lie.

From the foregoing, it will be appreciated that the present invention represents a significant advance in the field of integrated circuit packaging. In particular, the novel construction of the invention eliminates the need for soldering, removes the interconnect inductance of the fine wires used in conventional packaging constructions, dramatically increases the number of wafers that can be mounted on a single multilayer circuit board, and substantially reduces signal propagation time between the circuits. Although several preferred embodiments of the invention have been shown and described, it will be apparent that other adaptations and modifications can be made without departing from the spirit and scope of the invention. Accordingly, the invention is not to be limited, except as by the following claims.

I claim:

1. A semiconductor wafer packaging construction, comprising:

at least one semiconductor wafer, wherein each semiconductor wafer has a plurality of integrated circuits therein covering substantially the entire wafer and a plurality of contact areas;

at least one insulating board, wherein each insulating board has a plurality of openings therethrough, with at least some of the openings at positions corresponding to the wafer contact areas;

a circuit board having contact areas at positions corresponding to some of the insulating board openings;

a plurality of conductive connector elements disposed in selected ones of the openings in each insulating board, each of said connector elements including a wadded strand of conductive wire that is deformed when compressed; and means for compressing each wafer toward the circuit board, thereby compressing the wadded strand of each of the connector, each strand elements making multiple electrical contact between a corresponding wafer contact area and a circuit board contact area;

wherein the packaging construction is a wafer scale integrated circuit packaging construction.

2. The packaging construction as set forth in claim 1, wherein the circuit board is a multilayer printed circuit board.

3. The packaging construction as set forth in claim 1, wherein the circuit board is a layer-replaceable multilayer circuit board.

4. The packing construction as set forth in claim 3, wherein the layer-replaceable multilayer circuit board includes:

a plurality of two-sided circuit boards, each circuit board having a plurality of contact areas on both sides thereof and selected connections between the contact areas;

an insulating board with openings therethrough located between adjacent two-sided circuit boards, with at least some of the openings at positions corresponding to the two-sided circuit board contact areas; and a plurality of conductive connector elements disposed in selected ones of the openings in the insulating board to make electrical contact between the two-sided circuit board contact areas.

5. The packaging construction as set forth in claim 4, wherein:

each of the connector elements includes a wadded strand of conductive wire that is deformed when compressed between the two-sided circuit board contact areas and makes multiple electrical contacts between the contact areas.

6. The packaging construction as set forth in claim 3, wherein the layer-replaceable multilayer circuit board includes:

a plurality of two-sided circuit boards, each two-sided circuit board having a plurality of contact areas on both sides of the circuit board and selected connections between the contact areas;

an interconnecting circuit board with openings therethrough located between adjacent two-sided circuit boards, with at least some of the openings at positions corresponding to the two-sided circuit board contact areas;

a plurality of conductive connector elements disposed in selected ones of the openings in the interconnecting circuit board to make electrical contact between the two-sided circuit board contact areas; and a mylar sheet interposed between adjacent circuit boards to insulate the circuit boards from each other.

7. The packaging construction as set forth in claim 6, wherein:
each of the connector elements includes a wadded strand of conductive wire that is deformed when compressed between the two-sided circuit board contact areas and makes multiple electrical contacts between the contact areas.

8. The packaging construction as set forth in claim 1, and further including a housing serving as a heat sink for each wafer.

9. The packaging construction as set forth in claim 8, and further including leads extending from the housing for making electrical connections with each wafer.

10. The packaging construction as set forth in claim 1, further including a housing having recessed areas for the wafers, and wherein said circuit board is a multilayer circuit board, and further including a silicone pad interposed between the housing and the multilayer circuit board.

11. The packaging construction as set forth in claim 1, wherein the insulating board is fabricated from a glass ceramic.

12. The packaging construction as set forth in claim 1, wherein each wadded strand of wire has a density of approximately 20 to 30 percent.

* * * * *